United States Patent [19]

Muszkiewicz

[11] 3,801,922

[45] Apr. 2, 1974

[54] RF AMPLIFIER CONTROL SYSTEM

[75] Inventor: Robert P. Muszkiewicz, Getzville, N.Y.

[73] Assignee: GTE Sylvania Incorporated, Stamford, Conn.

[22] Filed: Aug. 21, 1972

[21] Appl. No.: 282,393

[52] U.S. Cl. ................. 330/29, 325/459, 330/30 R, 330/31, 330/40, 330/51, 330/126, 330/145

[51] Int. Cl. ................................................ H03g 3/30

[58] Field of Search ............ 330/21, 29, 31, 22, 40, 330/30 R, 126, 145, 51; 325/3, 457, 458, 459, 462

[56] References Cited

UNITED STATES PATENTS

| | | | |
|---|---|---|---|
| 3,673,507 | 6/1972 | Prescott | 330/51 X |
| 3,705,356 | 12/1972 | Russell | 325/459 X |
| 3,665,318 | 5/1972 | Hoffman et al. | 325/459 X |

*Primary Examiner*—Herman Karl Saalbach
*Assistant Examiner*—James B. Mullins
*Attorney, Agent, or Firm*—David M. Keay; Elmer J. Nealon; Norman J. O'Malley

[57] ABSTRACT

Two RF amplifiers may be selectively coupled and decoupled between a single antenna and a single mixer by switching circuits associated with each amplifier. A PIN diode is connected between the antenna and the input of each RF amplifier. A switching arrangement includes a complementary pair of transistors, one connected between a source of DC operating voltage and the amplifier and the other connected between the first transistor and the PIN diode. When the first transistor is biased to conduction by an appropriate control voltage, the associated RF amplifier is activated and DC current flows through both transistors causing the PIN diode to present a low impedance to RF signals from the antenna. When the first transistor is biased to cutoff by an appropriate control voltage, no current flows in the transistors inactivating the RF amplifier and causing the PIN diode to present a high impedance to RF signals from the antenna.

11 Claims, 1 Drawing Figure

PATENTED APR 2 1974 3,801,922
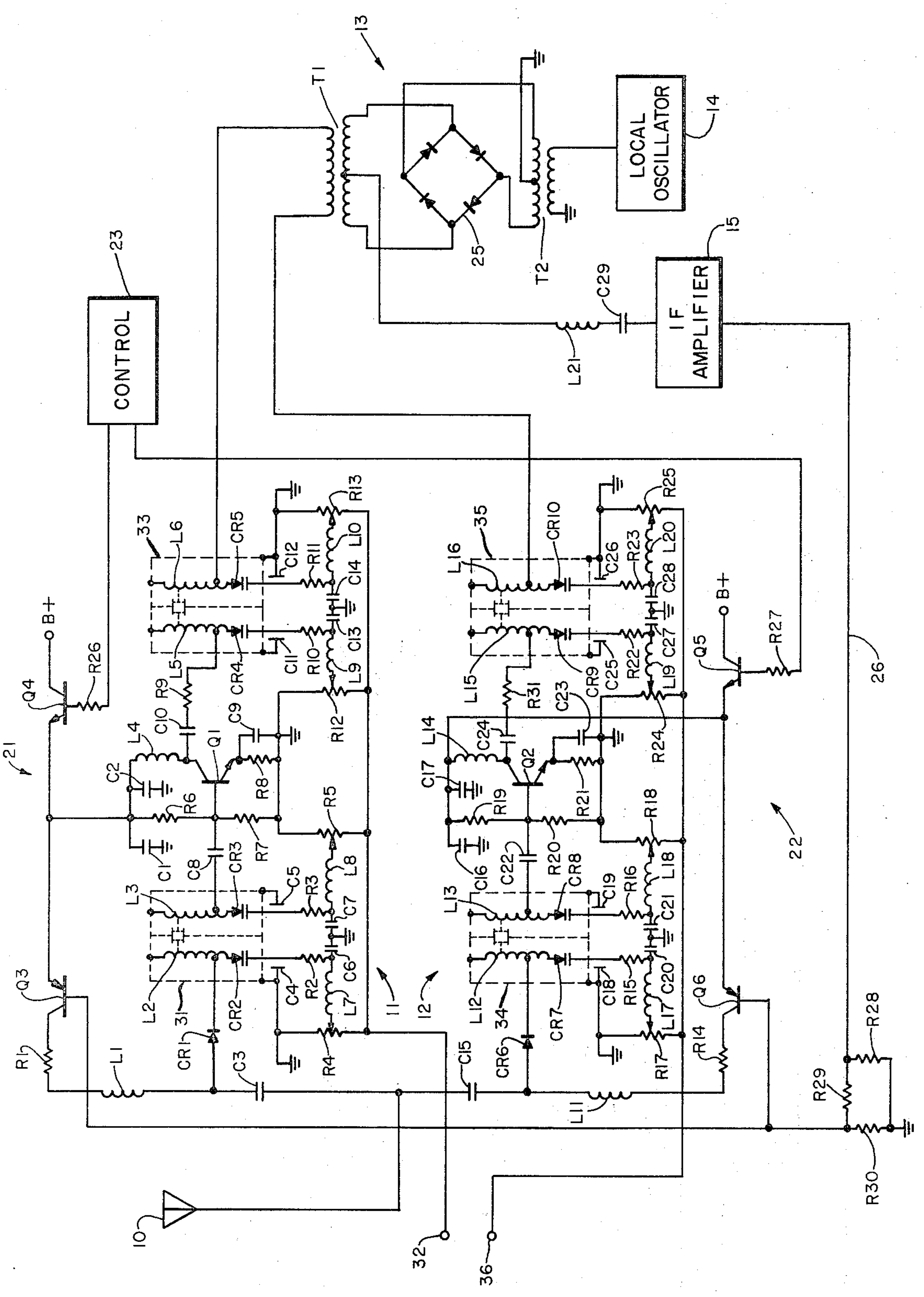

RF AMPLIFIER CONTROL SYSTEM

BACKGROUND OF THE INVENTION

This invention relates to RF amplifier systems. More particularly, it is concerned with apparatus for selectively coupling and decoupling either of two RF amplifiers between a single antenna and a single mixer circuit.

In broadband radio communication receivers, it is frequently necessary to employ more than one RF amplifier in order to cover the entire band of frequencies. Various techniques have been developed for electronically switching the RF amplifiers so as to selectively couple and decouple them to a single antenna and to a single mixer circuit. One well-known arrangement employs a PIN diode switch at the input and at the output of each of the RF amplifiers. In addition to requiring at least four PIN diodes, this system consumes power in both the input and the output switches and also requires elaborate decoupling arrangements between the switch control circuitry and the diode switches in order to maintain the selectivity characteristics of the system. Another technique employs a PIN diode switch at the input of each of the RF amplifiers and a hybrid power summation network at the RF amplifier outputs. This technique is relatively expensive because of the cost of the hybrid summation network. In addition, the hybrid summation network is bulky and its insertion loss is relatively high.

SUMMARY OF THE INVENTION

Apparatus in accordance with the present invention provides an improved all electronic technique for coupling and decoupling an RF circuit means, such as an RF amplifier, into and out of an RF system. The apparatus includes an input terminal and a variable RF impedance means, such as a PIN semiconductor diode, connected in series between the input terminal and the input connection of the RF circuit means. The value of the RF impedance of the variable RF impedance means is inversely related to DC current passing through it. The apparatus also includes a source of DC voltage.

A switching means having a control input connection is connected to the source of DC voltage, to the DC power connection of the RF circuit means, and to the variable RF impedance means. The switching means operates in response to a first input condition at its control input connection to permit the source of DC voltage to supply operating voltage to the RF circuit means and also to cause DC current to flow through the variable RF impedance means. The switching means also operates in response to a second input condition at its control input connection to prevent the source of DC voltage from supplying operating voltage to the RF circuit means and also to prevent DC current from flowing through the variable RF impedance means. Thus, the RF circuit means is activated and a low impedance is produced at its input in response to the first input condition at the switching means; and the RF circuit means is inactivated and a high impedance is produced at its input in response to the second input condition at the switching means.

BRIEF DESCRIPTION OF THE DRAWING

Additional objects, features, and advantages of RF circuit apparatus in accordance with the present invention will be apparent from the following detailed description together with the accompanying drawing wherein the single FIGURE is a schematic circuit diagram illustrating a system in accordance with the invention for coupling either of two RF amplifiers between a single antenna and a single double balanced mixer.

DETAILED DESCRIPTION OF THE INVENTION

The RF amplifier control system in accordance with the present invention as illustrated in the FIGURE includes a single antenna 10 which is connected to two RF amplifier circuits 11 and 12. The amplifier circuits are tuned to two different ranges of frequencies in order to cover a broad band of communication channels. The inputs to the first and second RF amplifier circuits 11 and 12 are coupled or decoupled to the antenna 10 by first and second diodes CR1 and CR6, respectively. The outputs from the RF amplifier circuits are taken through a single transformer T1 which provides coupling from whichever of the amplifiers is activated to a double balanced mixer 13. The output signal from a tuned local oscillator 14 is applied to the mixer through a second transformer T2. The output of the mixer 13 is coupled to an IF amplifier 15. The two RF amplifier circuits 11 and 12 are selectively coupled or decoupled between the antenna 10 and the mixer 13 by first and second switching arrangements 21 and 22, respectively. In the FIGURE, the switching arrangements are shown as being operated from a single control unit 23.

The first RF amplifier circuit 11 includes an amplifying section of a single common emitter stage employing an NPN transistor Q1. The RF amplifier circuit 11 also includes a tuned input circuit of a two-pole filter 31 coupled with a capacitive iris to provide a suitable resonant frequency. The desired tuned frequency is obtained by an appropriate voltage applied to varactor diodes CR2 and CR3 by way of a tuning input terminal 32. The amplifier circuit also includes a tuned output circuit of a two-pole filter 33 with varactor diodes CR4 and CR5.

The diode CR1 is a variable impedance diode, specifically a PIN diode, having an impedance to RF signals that is inversely related to the DC current passing through the diode. The diode is connected to the RF amplifier circuit 11 through a tap on the inductance L2 of the amplifier input circuit, and is connected to the antenna 10 by a capacitance C3.

The operating voltage for the amplifying section is provided by the voltage at the B+ terminal through the switching arrangement 21. The switching arrangement 21 includes a first NPN transistor Q4 which has its collector connected to the B+ terminal. The emitter of transistor Q4 is connected directly to the DC power connection for the amplifying section. The base of transistor Q4 is connected through a resistance R26 to the control 23 which supplies appropriate control voltages to the switching arrangement.

The switching arrangement 21 also includes a second PNP transistor Q3. The emitter of transistor Q3 is connected directly to the emitter of the first transistor Q4. Its collector is connected through a resistance R1 and an inductance L1 to the juncture between the PIN diode CR1 and the capacitance C3. The base of the second transistor Q3 is connected through a resistance network R28, R29, and R30 to ground and also to a feedback connection 26 from the IF amplifier 15 for providing automatic gain control.

The first RF amplifier circuit 11 is caused to be activated by a relatively high positive voltage applied to the base of the first transistor Q4 by the control 23. A relatively high voltage at the base of the NPN transistor Q4 biases that transistor into saturation thereby permitting sufficient current flow from the B+ voltage source to operate the amplifying section.

The high voltage available at the emitter of the second transistor Q3 when the first transistor Q4 is saturated biases transistor Q3 to saturation. Heavy DC current thus flows through the collector-emitter path of the first transistor Q4, the emitter-collector path of the second transistor Q3, the resistance R1, the inductance L1, the PIN diode CR1, and a portion of the inductance L2 to the grounded casing of the two-pole filter 31. Since the RF impedance of the PIN diode CR1 is inversely related to DC current flowing through it, a low impedance is provided by the diode CR1 at the input of the first RF amplifier circuit 11. Thus a low impedance path is provided for the RF signals from the antenna 10 to the diode CR1 to the RF amplifier circuit 11.

The inductance L1 provides a low impedance to DC current and a high impedance to RF signals from the antenna 10. The capacitance C3 provides a high impedance to DC current from the switching arrangement and a low impedance to RF signals from the antenna. Thus, the DC current passes through a low impedance path to the diode CR1 and is blocked from reaching the antenna 10, and RF signals from the antenna 10 pass to the diode CR1 and are blocked from reaching the switching arrangement.

When a relatively low control voltage is applied to the base of the first transistor Q4 by the control 23, that transistor is biased to cutoff. Therefore, no current can flow through transistor Q4 to the amplifying section and the RF amplifier circuit 11 is inactivated. In addition, current no longer flows through the second transistor Q3, and the flow of DC current through the diode CR1 terminates. Diode CR1 thus provides a relatively high impedance to RF signals from the antenna 10 and serves to electronically decouple the RF amplifier circuit 11 from the antenna.

The second RF amplifier circuit 12 and its associated switching arrangement 22 include elements corresponding to those in the first RF amplifier circuit 11 and its switching arrangement 21. The second RF amplifier circuit 12 and its switching arrangement 22 thus operate in the same manner under control of control voltages from the control unit 23.

The output from the RF amplifier circuits 11 and 12 is taken through a transformer T1 which has its primary winding connected between taps on the amplifier output inductances L6 and L16 thereby isolating the primary winding from ground. The secondary winding of transformer T1 is connected across a diode ring 25 in the mixer circuit 13. A tunable local oscillator 14 is connected to one terminal of the primary winding of the second transformer T2. The other terminal of the secondary winding of transformer T2 is connected to ground. The secondary winding of the second transformer T2 is connected across the appropriate terminals of the full-wave rectifier 25 and its center tap is connected to ground. The center tap of the secondary winding of the first transformer T1 is coupled through an inductance L21 and a capacitance C29 to the IF amplifier 15.

The output of the IF amplifier 15 is suitably detected to provide a DC automatic gain control signal on feedback line 26. The signal is applied by way of the voltage divider network R28, R29, and R30 to the second transistors Q3 and Q6 of the first and second switching arrangements 21 and 22, respectively. This circuitry provides automatic gain control for whichever of the RF amplifier circuits 21 and 22 is activated.

Assuming that the first RF amplifier circuit 11 is activated, DC current from the B+ source through the first transistor Q4 and the second transistor Q3 passes through the PIN diode CR1 causing the diode CR1 to provide a low impedance to RF signals from the antenna 10. When the output of the IF amplifier 15 reaches a sufficiently high level, current through the second transistor Q3 is reduced. Thus, the amount of DC current flowing through the PIN diode CR1 is reduced and the impedance of the diode to RF signals from the antenna 10 is increased.

The following is a list of the components employed in one specific embodiment of the RF amplifier circuits and switching arrangements as illustrated in the FIGURE.

| | | | |
|---|---|---|---|
| Q1 | 2N5031 | Q6 | 2N3906 |
| Q2 | 2N5031 | CR1 | HPA 3001 |
| Q3 | 2N3906 | CR2 | MSI SQ1220A |
| Q4 | 2N3904 | CR3 | MSI SQ1220A |
| Q5 | 2N3904 | CR4 | MSI SQ1220A |
| CR5 | MSI SQ1220A | R21 | 330 ohms |
| CR6 | HPA 3001 | R22 | 1000 ohms |
| CR7 | MSI SQ1220A | R23 | 1000 ohms |
| CR8 | MSI SQ1220A | R24 | 50 K ohms |
| CR9 | MSI SQ1220A | R25 | 50 K ohms |
| CR10 | MSI SQ1220A | R26 | 2.2 K ohms |
| R1 | 1000 ohms | R27 | 2.2 K ohms |
| R2 | 1000 ohms | R28 | 6.8 K ohms |
| R3 | 1000 ohms | R29 | 560 ohms |
| R4 | 50 K ohms | R30 | 27 K ohms |
| R5 | 50 K ohms | R31 | 97 ohms |
| R6 | 39 K ohms | C1 through C28 | 1000 pf |
| R7 | 10 K ohms | L1 | 1.0 μh |
| R8 | 330 ohms | L4 | .82 μh |
| R9 | 97 ohms | L7 | 2.2 μh |
| R10 | 1000 ohms | L8 | 2.2 μh |
| R11 | 1000 ohms | L9 | 2.2 μh |
| R12 | 50 K ohms | L10 | 2.2 μh |
| R13 | 50 K ohms | L11 | 1.0 μh |
| R14 | 1000 ohms | L14 | .82 μh |
| R15 | 1000 ohms | L17 | 2.2 μh |
| R16 | 1000 ohms | L18 | 2.2 μh |
| R17 | 50 K ohms | L19 | 2.2 μh |
| R18 | 50 K ohms | L20 | 2.2 μh |
| R19 | 39 K ohms | B+ | 9 volts |
| R20 | 10 K ohms | | |

The tuned input and output circuits of the RF amplifier circuits 11 and 12 included two-pole helical resonators 31 and 33, and 34 and 35 which were self-resonant at 700 MHz and 500 MHz, respectively. The input and output circuits were adjusted so as to cover the band of frequencies from 225 to 400 MHz by varactor diode control voltages applied at the tuning input terminals 32 and 36. The first amplifier circuit 11 was tuned to pass frequencies in the range of 300 to 400 MHz, and the second amplifier circuit 12 was tuned to pass frequencies in the range of 225 to 300 MHz. A control voltage of +9 volts was supplied by the control unit 23 to cause a switching arrangement to activate its associated RF amplifier circuit, and a voltage of 0 volts was supplied to hold an RF amplifier circuit deactivated.

While an RF amplifier circuit was activated, a current of approximately 10 milliamperes flowed through the variable impedance diode producing an insertion loss of about 0.2 dB. When no current was flowing through the variable impedance diode, the diode provided 25 dB of isolation from the antenna. The primary winding of the transformer T1 was connected to 50 ohm taps on the inductances L6 and L16, and the insertion loss at these output connections from the RF amplifiers was 0.2 dB. The RF amplifier sections employed produced a gain of 10 dB. The automatic gain control circuit arrangement was arranged to produce an increase in the RF impedance of the diode when a voltage level of between 7 and 9 volts was applied at the base of the appropriate second transistor Q3 or Q6.

The apparatus as described provides for selectively coupling or decoupling a pair of RF amplifiers between a single antenna and a single mixer solely by electronic circuitry without the use of electromechanical devices. The insertion loss produced by the input switching arrangement is relatively low and DC power consumption is low. Switching between the outputs of the RF amplifiers and the input to the mixer is performed without active switching circuitry and with no DC power consumption. In addition, the input switching arrangements can be employed so as to obtain automatic gain control.

Thus, while there has been shown and described what is considered a preferred embodiment of the present invention, it will be obvious to those skilled in the art that various changes and modifications may be made therein without departing from the invention as defined by the appended claims.

What is claimed is:

1. RF circuit apparatus including in combination

RF circuit means having an input connection, an output connection, and a DC power connection for applying operating voltage thereto;

an input terminal;

variable RF impedance means connected in series between the input terminal and the input connection of the RF circuit means, the value of the RF impedance of the variable RF impedance means being inversely related to the DC current passing therethrough;

a source of DC voltage; and switching means including first transistor means connected between said source of DC voltage and said DC power connection of the RF circuit means and having a control input connection connected thereto, said first transistor means being operable in a conducting condition in response to a first input condition being present at said control input connection thereby permitting said source of DC voltage to supply operating voltage to said RF circuit means, and being operable in a nonconducting condition in response to a second input condition being present at said control input connection thereby preventing said source of DC voltage from supplying operating voltage to said RF circuit means; and second transistor means connected between said first transistor means and said variable RF impedance means, said second transistor means being operable in a conducting condition when said first transistor means is in a conducting condition thereby permitting DC current to flow through said variable RF impedance means, and being operable in a nonconducting condition when said first transistor means is in a nonconducting condition thereby preventing DC current from flowing through said variable RF impedance means;

whereby said RF circuit means is activated and a low RF impedance is produced at the input thereto in response to the first input condition at said switching means, and said RF circuit means is inactivated and a high RF impedance is produced at the input thereto in response to the second input condition at said switching means.

2. Apparatus in accordance with claim 1 wherein said variable RF impedance means includes a semiconductor diode;

and including first input circuit means connected between the input terminal and the semiconductor diode for permitting the flow of RF current from the input terminal to the semiconductor diode and for preventing the flow of DC current from the source of DC voltage to the input terminal; and second input circuit means connected between the semiconductor diode and the second transistor means for permitting the flow of DC current from the second transistor means to the semiconductor diode and for preventing the flow of RF current from the input terminal to the second transistor means.

3. Apparatus in accordance with claim 2 wherein said first transistor means includes a first transistor of one conductivity type having its collector connected to said source of DC voltage, its base connected to said control input connection, and its emitter connected to the DC power connection of the RF circuit means; and said second transistor means includes a second transistor of the opposite conductivity type having its emitter connected to the emitter of the first transistor and its collector connected to the semiconductor diode.

4. Apparatus in accordance with claim 3 wherein said RF circuit means includes an RF amplifier; and including biasing control means connected to the base of said second transistor and operable to vary the current through the second transistor when the second transistor is in a conducting condition thereby varying the RF impedance between the input terminal and the input connection of the RF circuit means.

5. Apparatus in accordance with claim 1 including biasing control means connected to said second transistor means and operable to vary the current through the second transistor means when the second transistor means is in a conducting condition thereby varying the RF impedance of the variable RF impedance means.

6. An RF amplifier control system including in combination first RF amplifier means having an input connection, an output connection, and a DC power connection for applying operating voltage thereto;

second RF amplifier means having an input connection, an output connection, and a DC power connection for applying operating voltage thereto;

an input terminal;

first variable RF impedance means connected in series between the input terminal and the input connection of the first RF amplifier means;

second variable RF impedance means connected in series between the input terminal and the input connection of the second RF amplifier means;

the value of the RF impedance of each of the variable RF impedance means being inversely related to the DC current passing therethrough;

a source of DC voltage;

first switching means having a control input connection and being connected to said source of DC voltage, to said DC power connection of the first RF amplifier means, and to the first variable RF impedance means;

second switching means having a control input connection and being connected to said source of DC voltage, to said DC power connection of the second RF amplifier means, and to said second variable RF impedance means;

said first and second switching means each including a first transistor means connected between said source of DC voltage and said DC power connection of the associated RF amplifier means and having said associated control input connection connected thereto, a first transistor means being operable in a conducting condition in response to a first input condition being present at the associated control input connection thereby permitting said source of DC voltage to supply operating voltage to the associated RF amplifier means activating the RF amplifier means, and being operable in a nonconducting condition in response to a second input condition being present at the associated control input connection thereby preventing said source of DC voltage from supplying operating voltage to the associated RF amplifier means inactivating the RF amplifier means;

a second transistor means connected between said first transistor means and the associated variable RF impedance means, a second transistor means being operable in a conducting condition when the associated first transistor means is in a conducting condition thereby permitting DC current to flow through the associated variable RF impedance means producing a low impedance at the input to the associated RF amplifier means, and being operable in a nonconducting condition when said first transistor means is in a nonconducting condition thereby preventing DC current from flowing through the associated variable RF impedance means and producing a high RF impedance at the input to the associated RF amplifier means;

additional circuit means; and signal coupling means connected to the output connection of the first RF amplifier means, the output connection of the second RF amplifier means, and to the additional circuit means, said signal coupling means being operable when said first RF amplifier means is activated and said second RF amplifier means is inactivated to couple output signals from said first RF amplifier means to said additional circuit means, and operable when said first RF amplifier means is inactivated and said second amplifier means is activated to couple output signals from said second RF amplifier means to said additional circuit means.

7. A system in accordance with claim 6 wherein said first variable RF impedance means includes a first semiconductor diode;

said second variable RF impedance means includes a second semiconductor diode; and including a first input circuit means connected between the input terminal and the first semiconductor diode for permitting the flow of RF current from the input terminal to the first semiconductor diode and for preventing the flow of DC current from the source of DC voltage to the input terminal by way of the first switching means;

a second input circuit means connected between the first semiconductor diode and the second transistor means of the first switching means for permitting the flow of DC current from the second transistor means to the first semiconductor diode and for preventing the flow of RF current from the input terminal to the second transistor means;

another first input circuit means connected between the input terminal and the second semiconductor diode for permitting the flow of RF current from the input terminal to the second semiconductor diode and for preventing the flow of DC current from the source of DC voltage to the input terminal by way of the second switching means; and another second input circuit means connected between the second semiconductor diode and the second transistor means of the second switching means for permitting the flow of DC current from the second transistor means to the second semiconductor diode and for preventing the flow of RF current from the input terminal to the second transistor means.

8. A system in accordance with claim 7 wherein said first transistor means of the first switching means includes a first transistor of one conductivity type having its collector connected to said source of DC voltage, its base connected to the control input connection of the first switching means, and its emitter connected to the DC power connection of the first RF amplifier means;

said second transistor means of the first switching means includes a second transistor of the opposite conductivity type having its emitter connected to the emitter of the first transistor and its collector connected to the first semiconductor diode;

said first transistor means of the second switching means includes a first transistor of the one conductivity type having its collector connected to said source of DC voltage, its base connected to the control input connection of the second switching means, and its emitter connected to the DC power connection of the second RF amplifier means; and said second transistor means of the second switching means includes a second transistor of the opposite conductivity type having its emitter connected to the emitter of the first transistor and its collector connected to the second semiconductor diode.

9. A system in accordance with claim 8 wherein said first RF amplifier means includes a tuned output circuit having an inductance coupled to a point of reference potential;

said second RF amplifier means includes a tuned output circuit having an inductance coupled to said point of reference potential; and said signal coupling means includes a transformer having a primary winding with one terminal connected intermediate the ends of the inductance in the tuned output circuit of the first RF amplifier means and with the other terminal connected intermediate the ends of the inductance in the tuned output circuit of the second RF amplifier means.

10. A system in accordance with claim 9 wherein said additional circuit means includes an amplifier having an output connection; and including biasing control means connected to the base of the second transistor of the first switching means and to the base of the second transistor of the second switching means, said biasing control means being operable to vary the current through a second transistor when a second transistor is in a conducting condition thereby varying the RF impedance between the input terminal and the input connection of the associated RF amplifier means;

feedback means connected to the output connection of the amplifier of said additional circuit means and to said biasing control means and operable when the output of the amplifier exceeds a predetermined level to cause the biasing control means connected to a second transistor in a conducting condition to decrease current flow therethrough thereby increasing the RF impedance of the associated semiconductor diode.

11. A system in accordance with claim 6 including biasing control means connected to the second transistor means of the first switching means and to the second transistor means of the second switching means, said biasing control means being operable to vary the current through a second transistor means when a second transistor means is in a conducting condition thereby varying the RF impedance of the associated variable RF impedance means.

* * * * *